(12) United States Patent
Suruga et al.

(10) Patent No.: US 6,350,943 B1
(45) Date of Patent: Feb. 26, 2002

(54) ELECTRIC INSTRUMENT AMPLIFIER

(75) Inventors: Michio Suruga, Inagi; Yoshihiro Suzuki, Tama; Kentaro Matsumoto, Kawasaki, all of (JP)

(73) Assignee: Korg, Inc., Tokyo (JP)

( * ) Notice: Subject to any disclaimer, the term of this patent is extended or adjusted under 35 U.S.C. 154(b) by 0 days.

(21) Appl. No.: 09/750,861

(22) Filed: Dec. 28, 2000

(51) Int. Cl.[7] .............................. G10H 1/12; G10H 1/46
(52) U.S. Cl. .............................. 84/603; 84/661; 84/665; 84/DIG. 9; 84/DIG. 10
(58) Field of Search ............................. 84/603, 626–633, 84/662–665, 659–661, 701–711, 735–741, DIG. 9, DIG. 10

(56) References Cited

U.S. PATENT DOCUMENTS

5,789,689 A  8/1998  Doidic et al.

Primary Examiner—Stanley J. Witkowski
(74) Attorney, Agent, or Firm—Muramatsu & Associates (57) ABSTRACT

An electric instrument amplifier emulates an audio characteristics of a traditional vacuum-tube type amplifier. The electric instrument amplifier is formed in a single housing for amplifying an audio signal from an electric instrument. The electric instrument amplifier includes an A/D (analog-to-digital) converter for converting a first analog signal from the electric instrument to a digital signal, a digital signal processing circuit for processing the digital signal to add an intended effect to the digital signal, a D/A (digital-to-analog) converter for converting the digital signal processed by the digital signal processing circuit to a second analog signal, a tube amplifier having at least one vacuum-tube for amplifying the second analog signal, and a virtual power circuit formed with semiconductor devices for amplifying or attenuating an audio signal produced by the tube amplifier.

11 Claims, 7 Drawing Sheets

ELECTRIC INSTRUMENT AMPLIFIER

FIELD OF THE INVENTION

The present invention relates generally to an electric instrument amplifier which is used by connecting with an electric music instrument such as an electric guitar. In particular, the present invention relates to an electric instrument amplifier which is designed to emulate the audio characteristics associated with the traditional vacuum-tube-type amplifier.

BACKGROUND OF THE INVENTION

As semiconductor technology has become more advanced in recent years, the convenience of semiconductor devices, such as transistors and ICs, are increasingly available to be used with amplifiers for electrical instruments. Despite such semiconductor devices, however, vacuum-tube-type amplifiers can output its unique audio output characteristics, and thus, are still strongly popular today in the field of electric instruments and continue to be manufactured and sold on the market in large numbers.

Especially, a guitar amplifier using vacuum-tubes (vacuum-tube type amplifier) has been widely accepted due to its capability of bringing out the distorted sound features of an electric guitar. When the guitar amplifier using the vacuum-tube is set to overdrive, this distortion is synthetically produced through several steps in a pre-amplifier, driver stages of a power amplifier, the power amplifier itself, and matching transformers and speakers in the vacuum-tube type amplifier. Furthermore, a guitar amplifier can obtain an optimum distortion when outputting an extremely high sound volume. This is mainly the result of the additional distortion brought on from the later stages of circuit in the driver of the power amplifier driver. Many professional guitarists wish to use this vacuum-tube type amplifier for this reason.

However, as is well known in the art, in comparison to the semiconductor devices, the vacuum-tube type amplifier has several disadvantages such as a short life time with low reliability, storage inconvenience because it is large and heavy, high power and heat dissipation, and needs of high voltages, as well as it is relatively expensive. Using the vacuum-tube type amplifier will therefore be accompanied by such risks and drawbacks.

In order to resolve these problems, several inventions have been made to emulate the output characteristics of the vacuum-tube type amplifier by using semiconductor devices. Electric amplifiers using such technologies disclosed in the inventions have been in practical use.

An example of such inventions is the U.S. patent application Ser. No. 09/200,102 (hereafter be referred to as "prior art 1"). In this technology, the output signal of an amplifier that is structured by a small number of vacuum-tubes is amplified by a semiconductor circuit to create an amplifier capable of outputting a high sound volume, as if it were coming from a large number of vacuum-tubes. By doing so, the characteristics of the vacuum-tube type amplifier can be emulated.

However, the technology described in the prior art 1 is not structured to be in direct use with an electric instrument, like an electric guitar. Rather, it is designed to amplify the output of the later stage of the vacuum-tube type amplifier. Namely, the technology shown in the prior art 1 is not able to directly connect to an electric instrument.

In other words, the majority of such guitar amplifiers or guitar effect devices that use the vacuum-tube method are not integrated into one system. Thus, in an actual use, by connecting such guitar amplifiers or guitar effect devices through cables, and changing the connections or routings during the performance, changes among various tone settings are achieved in the performance. This conventional method produces a problem for guitarists during live performances and/or recordings, because an external switching system is required for changing the connections of the guitar amplifiers or guitar effect devices based on predetermined timings during the performance. This in turn increases the number of surrounding equipment, and can cause problems such as imperfect cable connections.

On the other hand, because of the recent development in the digital signal processing technology, such a digital technology is now frequently used in the electric music instruments. For example, digital effects such as digital emulators, equalizers, and reverberators, or digital speaker simulators which recreate speaker characteristics, have been in use with incorporating DSP (Digital Signal Processor) since the 1980s in order to reproduce the distortion characteristics of the pre-amplifier portion of the vacuum-tube type guitar amplifier.

These music devices, using the digital signal processors (DSP), can control the positioning, connections, and tone settings for each component (digital emulator, digital effect, and digital speaker simulator) by monitoring through liquid crystal displays. In addition, these music devices using the DSP, can receive information regarding switching timings through, for example, MIDI (Musical Instrument Digital Interface) signals. Thus, the data regarding the positioning, connections and tone settings stored in a memory in the music device can be automatically changed with use of a micro-controller.

Therefore, without the requirement of an external switching system, a guitarist can quickly change and control various tone settings by using the aforementioned devices having the DSP therein, power amplifier, and speaker cabinet. This method is also able to avoid the problems such as imperfect cable connections and to minimize the number of surrounding equipment.

Another example of conventional technology regarding the electric amplifier is capable of directly connecting to an electrical instrument. Such as an electric guitar is shown in the U.S. Pat. No. 5,789,689, titled "Tube Modeling Programmable Digital Guitar Amplification System" (hereafter be referred to as "prior art 2"). This patent explains how the guitar amplifier is placed under one housing system, and its technique on how to emulate the output characteristics of a vacuum-tube type amplifier.

The prior art 2 also explains that, after changing the music signals from the electric guitar to digital signals, the digital guitar amplification system adds the distortion property unique to the vacuum-tube type amplifier to the digital signals with use of a pre-amplifier effect, a nonlinear effect, and a linear effect. Then, the digital guitar amplification system converts the digital signals to analog signals and outputs as music signals.

In the prior art 2, however, since the digital guitar amplification system utilizes a nonlinear function produced by a digital signal processor in the course of emulating the vacuum-tube type amplifier, it can actually only emulate the pre-amplifier portion of the vacuum-tube type amplifier. There is no indication in this patent that the power amplifier portion of the vacuum-tube type amplifier has been devised. Hence, the distortion property of the vacuum-tube type amplifier is not being truly emulated. Accordingly, the digital guitar amplification system mentioned in the prior art 2 is not able to reproduce the vacuum-tube type amplifier with high fidelity.

SUMMARY OF THE INVENTION

It is, therefore, an object of the present invention to provide an electric instrument amplifier which has an integral form and can directly connect to an electric instrument such as an electric guitar to produce the distortion characteristics of a vacuum-tube type amplifier with use of digital technologies.

It is another object of the present invention to provide an electric instrument amplifier which amplifies music signals from the electric instrument with use of a minimum number of vacuum-tubes to produce output audio signals as though the audio signals were produced by many vacuum-tubes.

It is a further object of the present invention to provide an electric instrument amplifier which amplifies music signals from an electric instrument while adding the distortion property of the vacuum-tube type amplifier with high fidelity and with low cost.

In a preferred embodiment, the electric instrument amplifier of the present invention includes an A/D converter which converts an audio signal from an electric instrument to a digital signal. The digital signal is supplied to a digital signal processor. A boost effect in the digital signal processor amplifies the audio signal to a desired level, then adds the distortion to the audio signal through a pre-amplifier simulator. Processes such as equalization are performed on the audio signal which is also added with other effects such as ambience by a MOD/AMB effect.

The audio signal processed through the digital signal processor is converted to an analog signal by a D/A converter, and then supplied to a tube amplifier through a FET driver. The tube amplifier has a push-pull structure having a first vacuum-tube and a second vacuum tube and amplifies the audio signal from the D/A converter by push-pull operations. The amplified audio signal is then supplied to the virtual power circuit through a transformer.

The virtual power circuit is equipped with a current amplifier and a voltage amplifier, which creates a relationship of "Ac*Av=−K", where K is constant, Ac is current gain, and Av is voltage gain. Therefore, this makes the load impedance seen from the tube amplifier and the load impedance seen from the virtual power circuit substantially identical to one another. Accordingly, the audio signal generated by the virtual power circuit has the same output characteristics of the tube amplifier while a power level of which is either amplified or attenuated.

According to the present invention, the electric instrument amplifier can produce the audio signal which sounds as though it were created by using many vacuum-tubes although using only a minimum number of vacuum-tubes. The electric instrument amplifier of the present invention is advantageously used when being connected to electric instruments such as an electric guitar in a live performance. Further, since the entire device is formed in one housing, the number of equipment can be minimized and problems of cable connections can be avoided.

DETAILED DESCRIPTION OF THE PREFERRED EMBODIMENTS

Figure 1:
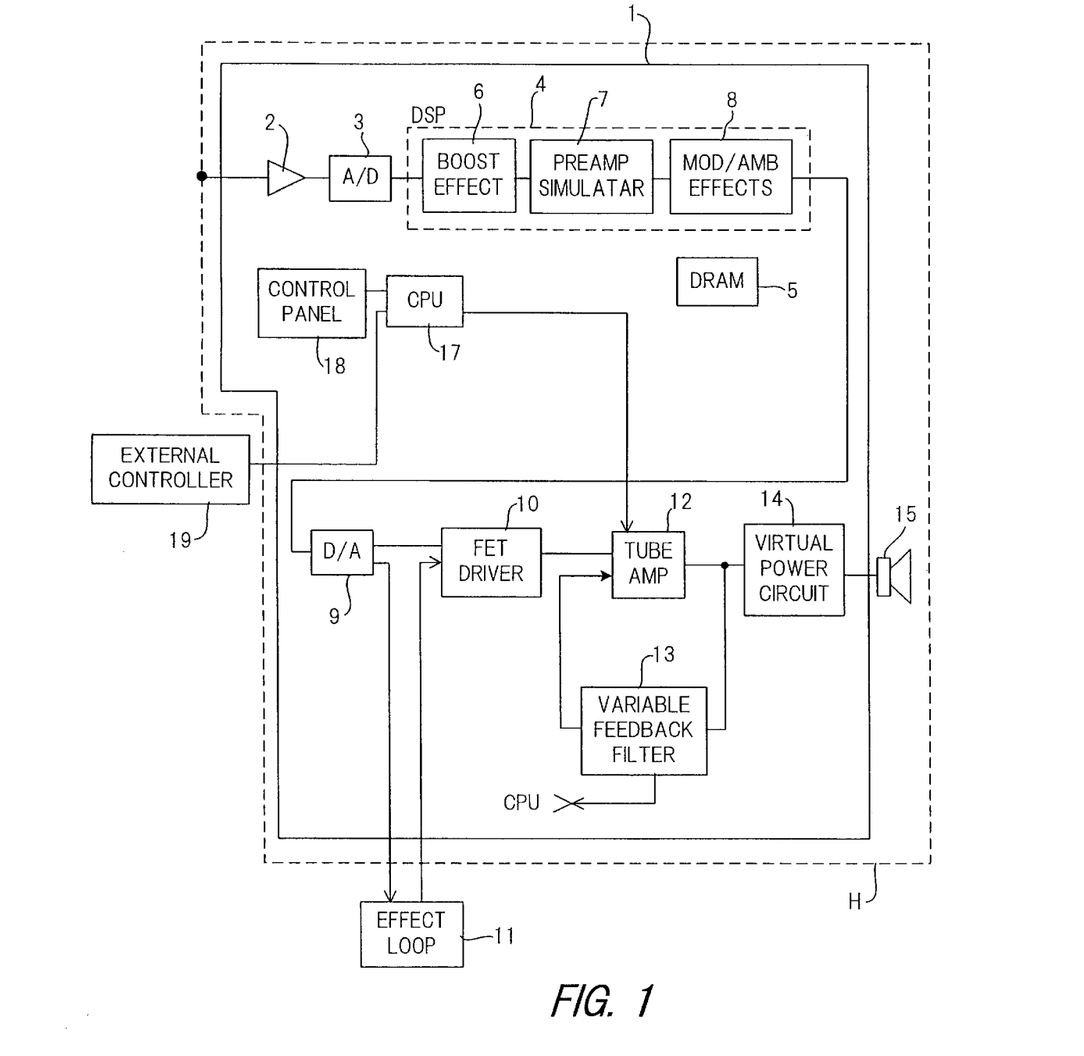
FIG. 1 is a block diagram showing an embodiment of structure in the electric instrument amplifier in accordance with the present invention.

FIG. 1 is a block diagram showing an embodiment of the electric instrument amplifier in the present invention. In this example, an overall set of an electric instrument amplifier 1 of the present invention is configured in one housing H. The electric instrument amplifier 1 includes an amplifier 2 which amplifies an audio signal (first analog signal) from an electric instrument, an A/D (analog-to-digital) converter 3 which converts the amplified audio signal from the amplifier 2 to a digital signal, and a digital signal processor (DSP) 4 which processes the digitized audio signal from the A/D converter 3 to add various effects such as distortion and ambience.

The DSP 4 includes a boost effect 6 which amplifies the input signal (digital signal from the A/D converter 3) with a predetermined gain for producing a signal having sufficient amplitudes for being processed in the later stages, a pre-amplifier simulator 7 which processes the digital signal amplified by the boost effect 6 to add the distortion characteristics, and a MOD/AMB effect 8 which adds the effects such as modulation and/or ambience to the digital signal from the pre-amplifier simulator 7. Further, the MOD/AMB effect 8 is connected to a DRAM (dynamic random access memory) 5 which temporarily stores the digital signal that has been processed.

The electric instrument amplifier 1 of FIG. 1 further includes a D/A (digital-to-analog) converter 9 which converts the digital signal from the DSP 4 to an analog audio signal (second analog signal), a FET (field effect transistor) driver 10 which is connected to the output of the D/A converter 9, and a tube amplifier 12 which is connected to the output of the FET driver 10.

An effect loop 11 which adds effects of external device such as reverberation to the analog audio signal is provided between the D/A converter 9 and the FET driver 10. The tube amplifier 12 is provided with a variable feedback filter 13 which feedbacks the output signal of the tube amplifier 12 to the input of the tube amplifier 12 while performing a filter process on the output signal.

The output of the tube amplifier 12 is further connected to a virtual power circuit 14 for amplifying or attenuating the output audio signal while maintaining the output characteristics of the tube amplifier. The output of the virtual power circuit 14 is connected to a speaker 15.

In addition, the DSP 4, the tube amplifier 12, and the variable feedback filter 13 are connected to CPU 17, which is a control center of the electric instrument amplifier 1 of the present invention. Under the control of the CPU 17, the boost effect 6 is set its gain for amplifying the incoming signal. Under the control of the CPU 17, the tube amplifier 12 is set its bias current, and the variable feedback filter 13 is set its parameters such as cutoff characteristics and gain.

The CPU 17 is connected to a control panel 18 and an external controller 19. An operator can freely input operation procedures through the control panel 18 and the external controller 19.

Figure 2:
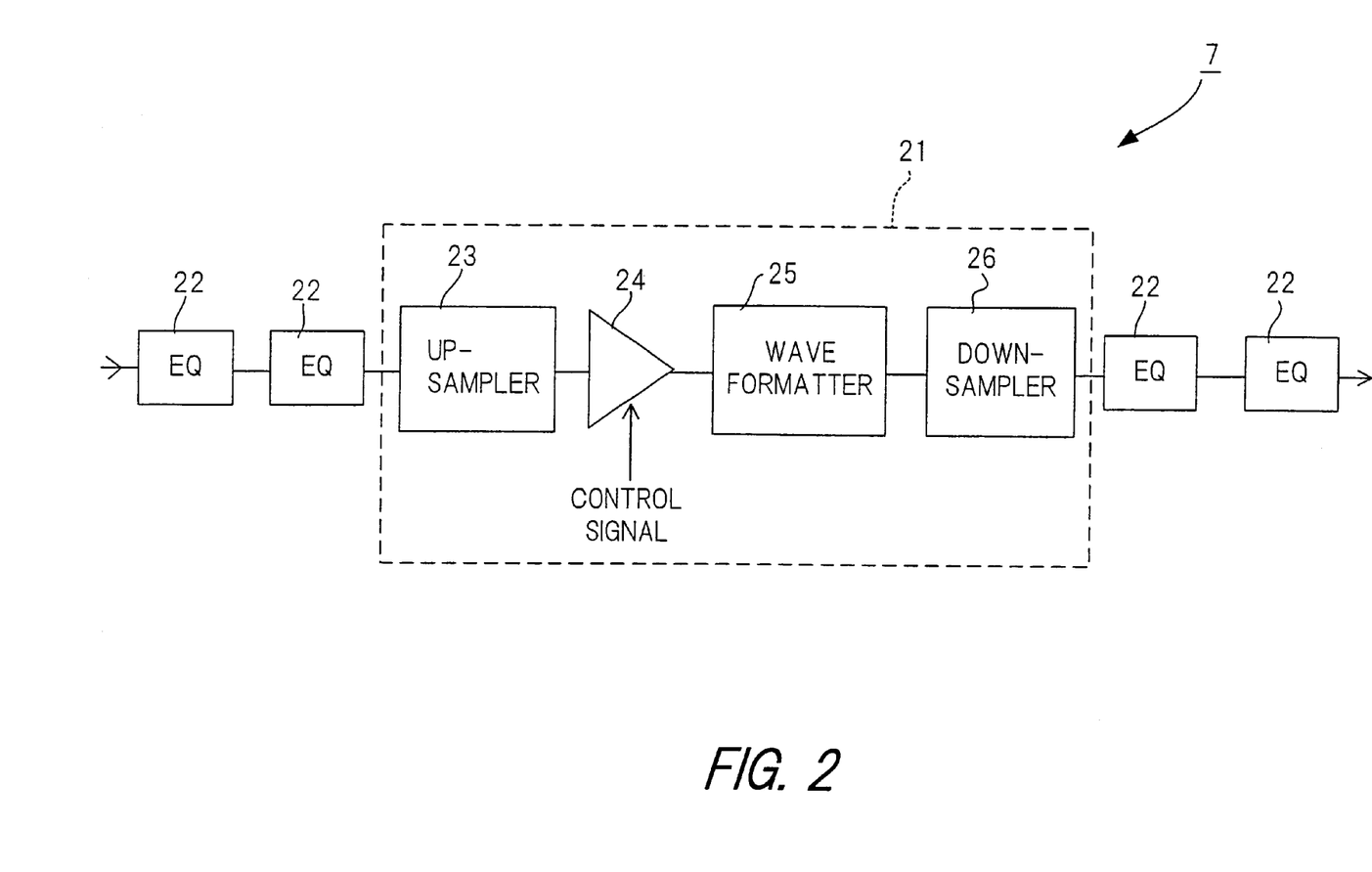
FIG. 2 is a block diagram showing the pre-amplifier simulator used in the present invention.

The block diagram of FIG. 2 shows an example of structure in the pre-amplifier simulator 7. In this example, the pre-amplifier simulator 7 is structured with a distortion adding circuit 21 and several stages of equalizer circuits 22 that are placed in the input side and the output side of the distortion adding circuit 21. The equalizer circuits 22 are structured, for instance, with a highpass filter, a lowpass filter, and a bandpass filter, for adjusting and modifying the frequency characteristics of the input digital signal.

The distortion adding circuit 21 is structured with an up-sampler circuit 23 which increases a sampling frequency of the digital signal, an amplifier 24 which amplifies the digital signal from the up-sampler circuit 23 by multiplying a variable gain control signal, a saturation type wave formatter 25 which provides distortion to each sample in the digital signal from the amplifier 24, and a down-sampler 26 which decreases sampling frequency of the digital signal from the saturation type wave formatter 25 to the original frequency.

Figure 3:
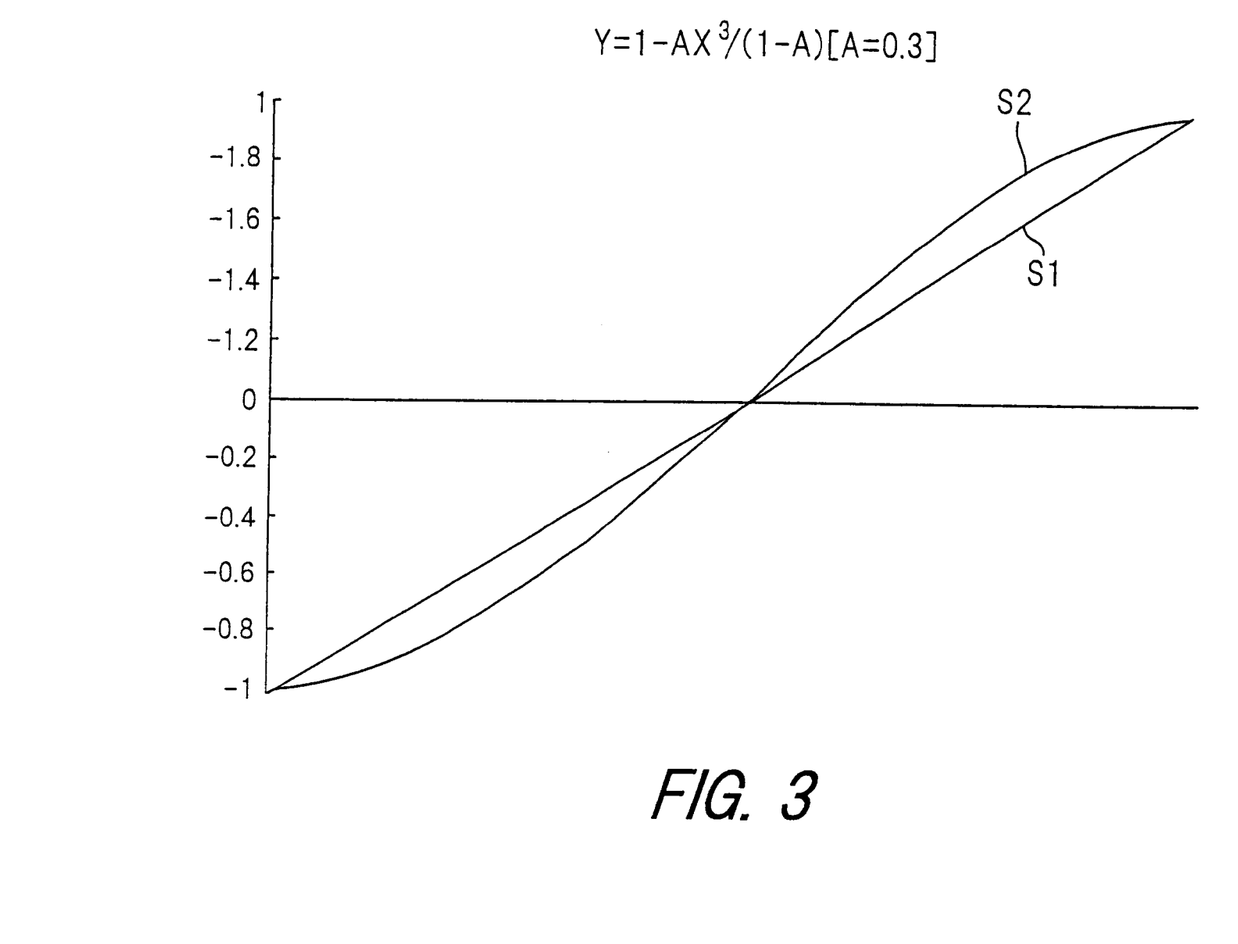
FIG. 3 is a graph showing a relationship between the input and output signals in the saturation type wave formatter used in the present invention.

FIG. 3 is a graph showing the relationship between the input and output of the saturation type wave formatter 25. For example, FIG. 3 shows that with an input signal X, an output signal Y can be obtained by using the equation (1) in the following:

$$Y=(1-AX^3)/(1-A) \qquad (1)$$

Figure 4:
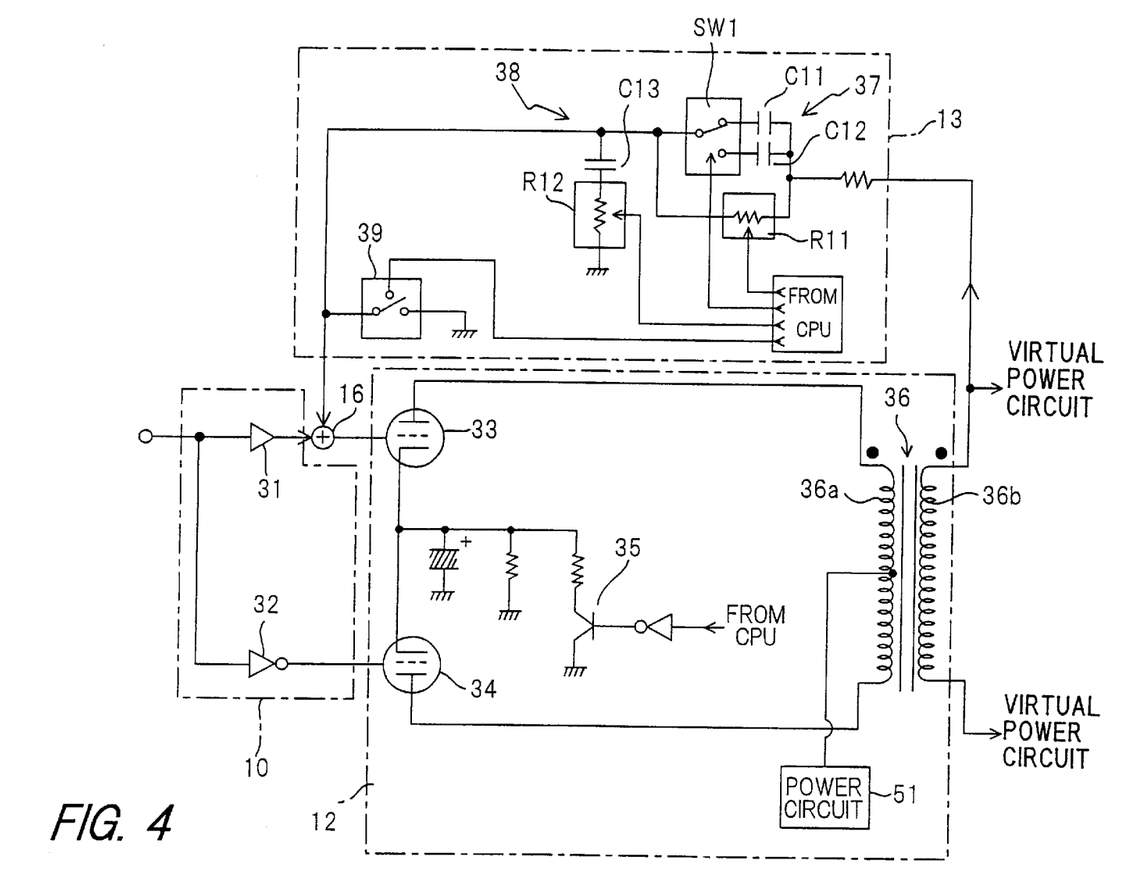
FIG. 4 is a circuit diagram showing an example of structure in the FET driver, tube amplifier, and variable feedback filter in the present invention.

(A is between 0–0.35; A=0.3 in FIG. 3) FIG. 4 is a circuit diagram showing an example of structure in the FET driver 10, the tube amplifier 12, and the variable feedback filter 13, respectively. As shown in the lower left of FIG. 4, the FET driver 10 is formed with a non-inverting amplifier 31 and an inverting amplifier 32. As shown in the lower right of FIG. 4, the tube amplifier 12 is equipped with a first vacuum-tube 33 and a second vacuum-tube 34 that are connected with one another at the cathodes. This connection point is further connected to the ground through a switching transistor 35. The CPU 17 shown in FIG. 1 controls the on/off operation of the switching transistor 35, and thus, the tube amplifier 12 operates as an A-class amplifier when the switching transistor 35 is turned on, and as an A/B-class amplifier when the switching transistor 35 is turned off.

The plates of the first vacuum-tube 33 and the second vacuum-tube 34 are connected to a primary coil 36a of a transformer 36. One terminal of a secondary coil 36b of the transformer 36 is connected to the virtual power circuit 14 shown in FIG. 1. Another terminal of the secondary coil 36b is connected to the variable feedback filter 13 shown in the upper part of FIG. 4. The center tap of the primary coil 36a of the transformer 36 is connected to a power circuit 51 to receive a supply voltage.

The variable feedback filter 13 shown in FIG. 4 is equipped with a highpass filter 37, a lowpass filter 38, and a switch circuit 39. The highpass filter 37 includes two capacitors C11 and C12 which are arranged in a parallel fashion and have capacitance values different from one another, a switch SW1 which selects one of the two capacitors C11 and C12 to be connected to the lowpass filter 38, and a programmable attenuator R11. Therefore, by controlling the on/off operation of the switch SW1 and the resistance value of the programmable attenuator R11 by control signals from the CPU 17, the cutoff frequency characteristics and the gain of the variable feedback filter 13 can be freely regulated.

In the variable feedback filter 13, the lowpass filter 38 is formed with a capacitor C13 and a programmable attenuator R12. Thus, in a similar manner, by controlling the resistance value of the programmable attenuator R12 by the CPU 17, the cutoff frequency of the lowpass filter 38 can be freely regulated.

Further, the output of the lowpass filter 38 is connected to an adder 16 to be added to the output signal of the non-inverting amplifier 31. The output of the lowpass filter 38 is also connected to the ground through the switch circuit 39. The switch circuit 39 can switch on and off under the control of the CPU 17. Therefore, when operating the tube amplifier 12 as the A-class amplifier when turning the switching transistor 35 on, the CPU 17 controls to turn the switch circuit 39 on. When operating the tube amplifier 12 as the A/B-class amplifier when turning the switching transistor 35 off, the CPU 17 controls to turn the switch circuit 39 off.

Figure 5:
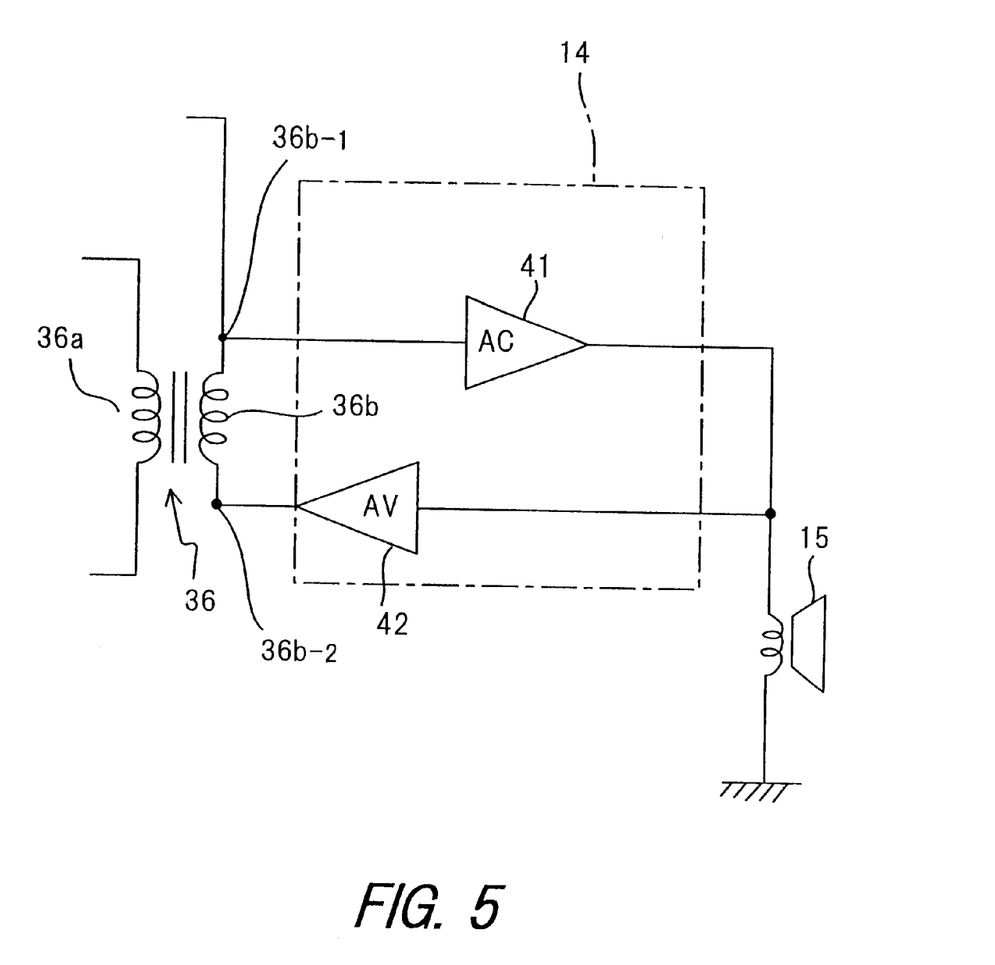
FIG. 5 is a block diagram showing an example of structure in the virtual power circuit used in the present invention.

FIG. 5 is a circuit diagram showing an example of structure in the virtual power circuit 14. In this example, the virtual power circuit 14 includes a current amplifier 41 which is connected to a first terminal 36b-1 of the secondary coil 36b of the transformer 36, and a voltage amplifier 42 which is connected between the output of the current amplifier 41 and a second terminal 36b-2 of the secondary coil 36b of the transformer 36. The speaker 15 is connected to the connection point of the current amplifier 41 and the voltage amplifier 42.

The current gain Ac of the current amplifier 41 and the voltage gain Av of the voltage amplifier 42 have a relationship of "Ac*Av=−1". As a consequence, the load impedance seen from the tube amplifier 12 and the load impedance seen from the virtual power circuit 14 become almost identical to one another. Although the embodiment of the present invention will be explained for the relationship of "Ac*Av=−1", a generalized expression of the relationship will be given by "Ac*Av=−K", where K is constant.

Figure 6:
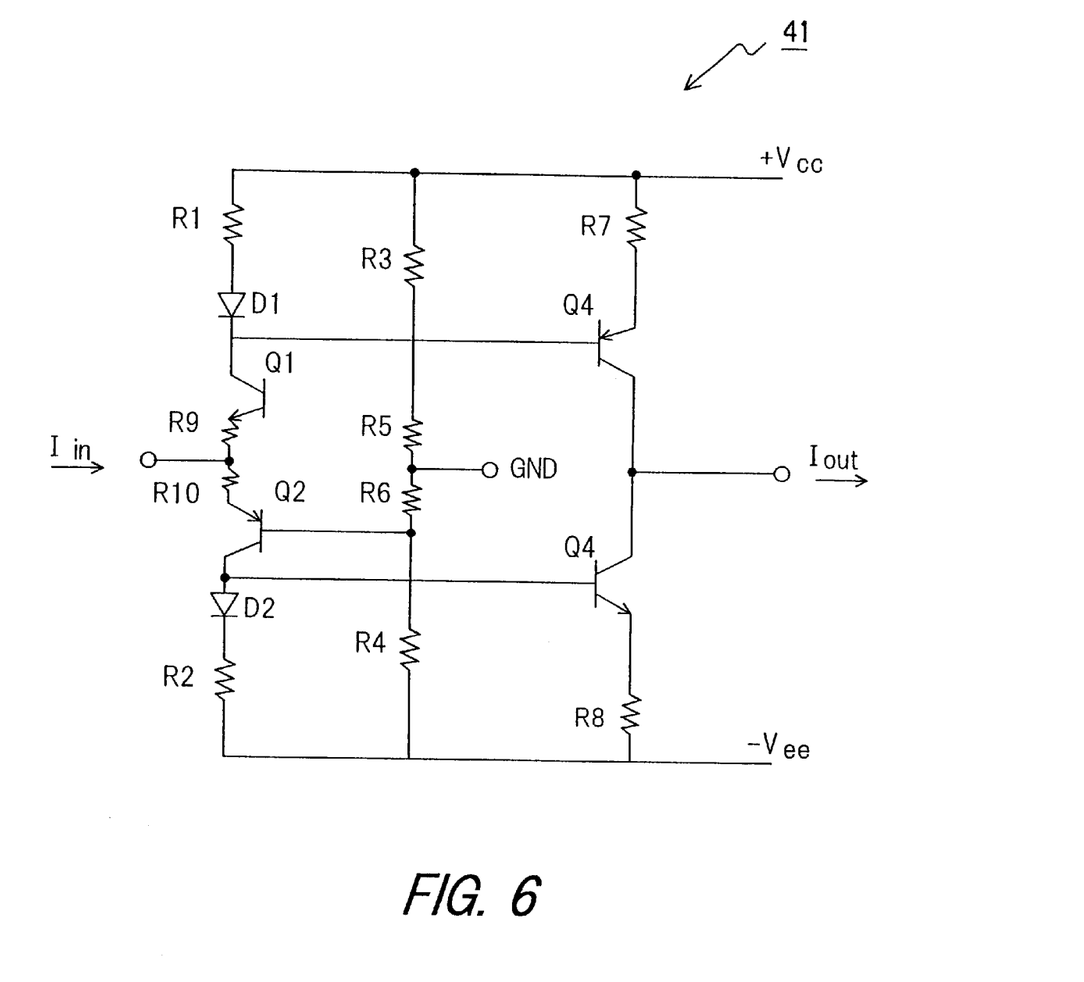
FIG. 6 is a circuit diagram showing an example of structure in the current amplifier in the virtual power circuit of FIG. 5.

FIG. 6 is a circuit diagram showing an example of structure in the current amplifier 41. As shown in the diagram, the current amplifier 41 is structured with junction transistors Q1–Q4, diodes D1 and D2, and resistors R1–R10. The current amplifier 41 is provided between the power sources +Vcc and −Vee.

At the input side of the current amplifier 41, the emitters of the transistor Q1 (NPN type) and the transistor Q2 (PNP type) are connected with one another through two resistors R9 and R10. The collector of the transistor Q1 is connected to power source +Vcc through the diode D1 and the resistor R1. The collector of the transistor Q2 is connected to the power source −Vee through the diode D2 and the resistor R2. A series circuit of the resistors R3, R5, R6, and R4 is connected between the power sources +Vcc and −Vee. The connection point of the resistors R3 and R5 is connected to the base of the transistor Q1, and the connection point of the resistors R6 and R4 is connected to the base of the transistor Q2. The collector of the transistor Q1 is connected to the base of the transistor Q3 (PNP type), and the collector of the transistor Q2 is connected to the base of the transistor Q4 (NPN type). The collectors of the transistors Q3 and Q4 are connected together as an output terminal. The emitter of the transistor Q3 is connected to the power source −Vcc through the resistor R7, and the emitter of the transistor Q4 is connected to the power source −Vee through the resistor R8.

Between the resistors R9 and R10, which are located between the transistors Q1 and Q2, an input current $I_{in}$ is supplied. The resistors R5 and R6 are connected to the ground. An output current $I_{out}$ is output at the connection point of the collectors of the transistors Q3 and Q4.

Figure 7:
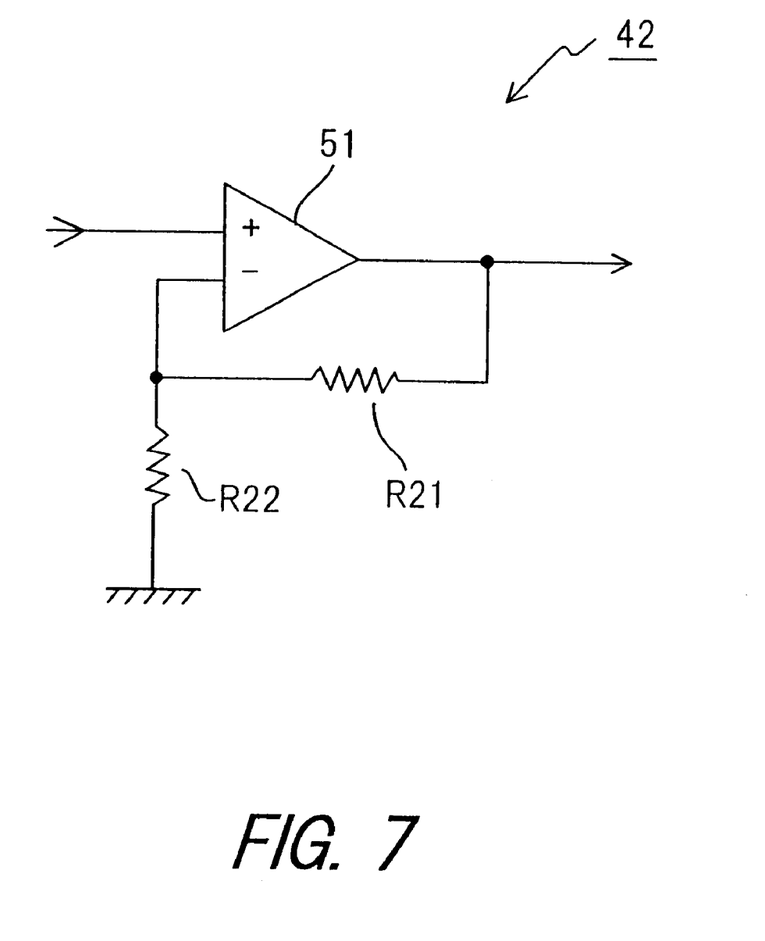
FIG. 7 is a circuit diagram showing an example of structure in the voltage amplifier in the virtual power circuit of FIG. 5.

FIG. 7 is a circuit diagram showing an example of structure in the voltage amplifier 42. The voltage amplifier 42 is formed with an operational amplifier 51 and two resistors R21 and R22.

An operation of the electric instrument amplifier in the embodiment of the present invention will be explained hereafter with reference to the drawings.

An output terminal of an electric instrument such as an electric guitar is connected to an input terminal T1 of the electric instrument amplifier 1 of FIG. 1. The output signal (first analog signal) from the electrical instrument is amplified by the amplifier 2 to a predetermined power level. Then the first analog signal amplified by the amplifier 2 is converted to a digital signal by the A/D converter 3 and supplied to the DSP 4.

In the boost effect 6, the digital signal from the A/D converter 3 is amplified until it reaches a sufficient power level that is capable of being processed in the pre-amplifier simulator 7.

As shown in FIG. 2, the pre-amplifier simulator 7 is equipped with the distortion adding circuit 21 and several stages of the equalizer circuits 22. Each equalizer circuit 22 includes various filters such as the highpass filter, the lowpass filter, and the bandpass filter, to equalizing the incoming signal.

The up-sampler 23 of the distortion adding circuit 21 is structured to increase the sampling frequency of the digital signal. This in turn, increases the Nyquist frequency (half of the sampling frequency), thereby reducing the effects of aliasing noise.

The digital signal whose sampling frequency is increased by the up-sampler 23 is then amplified to a predetermined level by the amplifier 24. The amplified digital signal is then processed to be added with the distortion through the saturation type wave formatter 25. This saturation type wave formatter 25 has an input/output characteristics shown in FIG. 3, wherein the input signal in a straight line S1 is distorted to the output signal in a curved line S2.

The digital signal, after having the distortion added thereto by the saturation type wave formatter 25, is then processed to decrease the sampling frequency back to its original frequency (the sampling frequency before being applied to the up-sampler 23) by the down-sampler 26. The digital signal is then equalized through the plural stages of the equalizer circuits 22.

The digital audio signal, after having the distortion added thereto by the pre-amplifier simulator 7, is then input to the MOD/AMB (modulation and/or ambience) effect 8 as shown FIG. 1. This MOD/AMB effect 8 processes the input digital signal, for example, by adding echoes to the digital signal. Then, the DRAM 5 will temporarily store the digital audio signal, and will reproduce the digital audio signal, for example, with a predetermined delay time.

The digital audio signal processed by the DSP 4 is then converted to an analog audio signal (second analog signal) by the D/A converter 9. The audio signal is supplied to the FET driver 10 and the effect loop 11 in FIG. 1. This effect loop 11 has external input and output terminals for performing processes, such as reverberation and enhancement, on the audio signal from an external device.

As shown in FIG. 4, the audio signal provided to the FET driver 10 is separated into two. One audio signal is input to the non-inverting amplifier 31, and the other is input to the inverting amplifier 32.

The audio signal amplified by the non-inverting amplifier 31 is supplied to the grid of the first vacuum-tube 33, and the audio signal amplified by the inverting amplifier 32 is supplied to the grid of the second vacuum-tube 34. As noted above, the cathode of the first vacuum-tube 33 and the cathode of the second vacuum-tube 34 are connected with one another. The anode of the first vacuum-tube 33 and the anode of the second vacuum-tube 34 are connected to respective ends of the primary coil 36a of the transformer 36. Further, the center-tap of the primary coil 36a is provided with a voltage by the power source 51. Accordingly, the audio signal from the non-inverting amplifier 31 and the audio signal from the inverting amplifier 32 are amplified by a push-pull operation of the first vacuum-tube 33 and the second vacuum-tube 34. Of course, the vacuum-tube 33 and vacuum-tube 34 can be replaced with a multiple-unit tube.

The audio signal is further amplified by a gain determined by the winding ratio of the transformer 36, and is output through the secondary coil 36b.

The audio signal output through the secondary coil 36b is then input to the variable feedback filter 13. In the variable feedback filter 13, the cutoff characteristics of the highpass filter 37 and the cutoff characteristics of the lowpass filter 38 are freely regulated under the control of the CPU 17. More particularly, the cutoff characteristics of the highpass filter 37 can be controlled by operating the switch SW1 to choose either one of the two capacitors C11 and C12, and by regulating the resistance value of the programmable attenuator R11. The cutoff characteristics of the lowpass filter 38 can be controlled by regulating the resistance value of the programmable attenuator R12.

The adder 16 is then supplied with the feedback signal that has been processed through the highpass filter 37 and the lowpass filter 38. The feedback signal is added to the audio signal from the non-inverting amplifier 31 by the adder 16, and therefore, an increased effect can be achieved to the audio signal. When operating the tube amplifier 12 as the A-class amplifier, both the switching transistor 35 and the switch circuit 39 are turned on. In this situation, since the signal that passes through the variable feedback filter 13 will not be supplied to the adder 16, the effect of the variable feedback filter 13 is not added to the audio signal.

On the other hand, when operating the tube amplifier 12 as the A/B-class amplifier, both the switching transistor 35 and the switch circuit 39 are turned off. The signals that pass through the variable feedback filter 13 will then be supplied to the adder 16, thus, the effect of the variable feedback filter 13 is add to the audio signal.

As mentioned above, the virtual power circuit 14 connected to the secondary coil 36b establishes the relationship of "Ac*Av=−1" by the current amplifier 41 with the current gain Ac and the voltage amplifier 42 with the voltage gain Av. This makes the impedance of the load seen from the tube amplifier 12 and the impedance of the load seen from the virtual power circuit 14 substantially the same. Accordingly, the tube amplifier 12 performs as if it were directly connected to the speaker (15). Thus, the electric instrument amplifier 1 of the present invention is able to amplify or attenuate the output characteristics of the tube amplifier 12 in a desired level while maintaining the output characteristics.

The output power of the virtual power circuit 14 is proportional to the square of the current gain Ac of the current amplifier 41. For example, if "Ac=−3.16" and "Av=0.316", the output power will be $-3.16^2$, or 10, which means that the output signal of the tube amplifier 12 will be increased by ten times.

The above mentioned embodiment has the relationship of "Ac*Av=−1", however, this is only when there is one speaker 15. If there are two speakers connected in parallel, then the equation will be "Ac*Av=−2", and if connected in series, then it will be "Ac*Av=−½".

The operation regarding the current amplifier 41 shown in FIG. 6 will now be explained. In this example, the voltage provided on the base of the transistor Q2 is derived from the source voltage −Vee divided by the two resistors R4 and R6 connected between the source voltage −Vee and the ground GND, i.e., "{R4/(R4+R6)} *(−Vee)". Because of this base voltage, the transistor Q2 is active so that the current flows between the collector and the emitter, which has substantially the same value of the input current $I_{in}$. As a result, the voltage drop by the resistor R2 becomes "$R2*I_{in}$" when neglecting the voltage drop across the diode D2.

The voltage drop by the resistor R2 is also provided to the base of the transistor Q4, thus also making the voltage across the resistor R8 to become "$R2*I_{in}$". Based on this, the current that flows through the emitter of the transistor Q4 is "$R2*I_{in}/R8$", which flows toward (pull in) the collector of the transistor Q4. This collector current is an output current $I_{out}$ which is expressed by the following equation (2) while reversing the polarity:

$$I_{out}=-(R2/R8)*I_{in} \quad (2)$$

As defined by the equation (2), the output current $I_{out}$ of the current amplifier 41 is −(R2/R8) times of the input current $I_{in}$. Therefore, by properly adjusting the resistance values of the resistors R2 and R8, the desired gain of the current amplifier can be achieved. The foregoing explanation is made for the lower portion of the circuit (from transistors Q2 & Q4) shown in FIG. 6. Since the upper portion of the circuit (from transistors Q1 and Q3) of FIG. 6 operates in the same way, the operation of which is not described here. Consequently, the upper and lower portions of the circuit of FIG. 6 will be activated depending on the polarity of the input current to properly amplify the input current.

An example of resistance and voltage values in the circuit arrangement of FIG. 6 is as follows:

R1, R2=5 ohms

R3, R4=150 ohms

R5, R6=5 ohms

R7, R8=2.5 ohms

R9, R10=0.5 ohms

+Vcc=+20V

−Vee=−20V

With these values, since "R2/R8=2", the current gain in the current amplifier 41 is two (2). In addition, the two resistors R9 and R10 and the two diodes D1 and D2 are used to stabilize the operation of the current amplifier 41.

In summary, the electric instrument amplifier 1 of the present invention includes a tube amplifier 12 having the minimum possible number of vacuum-tubes and is capable of obtaining an output characteristic that sounds as if it were coming from many vacuum-tubes. Also, the electric instrument amplifier 1 of the present invention can realize utmost use of the output characteristics of a vacuum-tube when amplifying the output signal of an electric instrument, such as an electric guitar.

Although the vacuum-tube is known for its disadvantages, such as a short life span and low reliability, storage inconvenience, high power and heat dissipation, and high voltage requirement, the electric instrument amplifier of the present invention can emulate the output characteristics of a traditional vacuum-tube type amplifier by using the minimum number of small vacuum-tubes.

Furthermore, the electric instrument amplifier of the present invention is structured under one housing H, and thus, can be directly connected to an electrical instrument. This in turn will help minimizing the number of surrounding equipment during live performances and recordings, and problems like involving imperfect cable connections can be avoided.

In the foregoing, the embodiment is described for the case where the tube amplifier has two vacuum-tubes 33 and 34, however, the electric instrument amplifier of the present invention can also be achieved with the tube amplifier having three or more vacuum tubes or only one vacuum-tube.

Although only a preferred embodiment is specifically illustrated and described herein, it will be appreciated that many modifications and variations of the present invention are possible in light of the above teachings and within the purview of the appended claims without departing the spirit and intended scope of the invention.

What is claimed is:

1. An electric instrument amplifier configured in a single housing for amplifying an audio signal from an electric instrument while emulating a characteristics of a vacuum-tube amplifier, comprising:

an A/D (analog-to-digital) converter for converting a first analog signal from the electric instrument to a digital signal;

a digital signal processing circuit for processing the digital signal to add an intended effect to the digital signal;

a D/A (digital-to-analog) converter for converting the digital signal processed by the digital signal processing circuit to a second analog signal;

a tube amplifier having at least one vacuum-tube for amplifying the second analog signal; and a virtual power circuit formed with semiconductor devices for amplifying or attenuating an audio signal produced by the tube amplifier.

2. An electric instrument amplifier as defined in claim 1, further comprising a feedback filter for applying a filter process to an output signal of the tube amplifier and returning the output signal that has been filter processed to an input of the tube amplifier.

3. An electric instrument amplifier as defined in claim 2, wherein the feedback filter includes means for adjusting a filter characteristics of the feedback filter.

4. An electric instrument amplifier as defined in claim 1, further comprising a driver circuit provided at an input of the tube amplifier for driving the vacuum-tube mounted on the tube amplifier.

5. An electric instrument amplifier as defined in claim 4, wherein the driver circuit includes two amplifier circuits each generating a drive signal having a phase opposite to one another, wherein the tube amplifier has two vacuum-tubes or a multiple-unit tube, and wherein the two amplifier circuits drive the two vacuum-tubes or the multiple-unit tube to achieve a push-pull operation.

6. An electric instrument amplifier as defined in claim 5, wherein cathodes of the two vacuum-tubes or the multiple-unit tube are connected with one another, and the electric instrument amplifier further comprising means for switching a connection between the cathodes and a ground, thereby changing a form of the tube amplifier between an A-class amplifier and an A/B-class amplifier.

7. An electric instrument amplifier as defined in claim 4, further comprising an effect loop circuit at an input of the driver circuit.

8. An electric instrument amplifier as defined in claim 1, wherein the digital signal processing circuit includes a boost effect circuit for amplifying the digital signal with a predetermined gain, a pre-amplifier simulator for adding distortion properties to the digital signal, and a MOD/AMB circuit for adding modulation and/or ambience effects to the digital signal.

9. An electric instrument amplifier as defined in claim 8, wherein the pre-amplifier simulator includes a plurality of equalizer circuits.

10. An electric instrument amplifier as defined in claim 9, wherein the pre-amplifier simulator includes a distortion adding circuit.

11. An electric instrument amplifier as defined in claim 1, wherein the virtual power circuit includes a current amplifier and a voltage amplifier connected to a secondary coil of a transformer of the tube amplifier, wherein a current gain Ac of the current amplifier and a voltage gain Av of the voltage amplifier have a relationship of "Ac*Av=−K", where K is constant.

* * * * *